US012588296B2

(12) United States Patent
Sun

(10) Patent No.: US 12,588,296 B2
(45) Date of Patent: Mar. 24, 2026

(54) ESD GUARD RING STRUCTURE AND FABRICATING METHOD OF THE SAME

(71) Applicant: UNITED MICROELECTRONICS CORP., Hsin-Chun City (TW)

(72) Inventor: Chia-Chen Sun, Kaohsiung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 396 days.

(21) Appl. No.: 18/380,647

(22) Filed: Oct. 16, 2023

(65) Prior Publication Data

US 2025/0098333 A1 Mar. 20, 2025

(30) Foreign Application Priority Data

Sep. 18, 2023 (CN) .......................... 202311203190.2

(51) Int. Cl.
*H10D 89/60* (2025.01)
*H10D 89/10* (2025.01)

(52) U.S. Cl.
CPC ........... *H10D 89/921* (2025.01); *H10D 89/10* (2025.01); *H10D 89/931* (2025.01)

(58) Field of Classification Search
CPC ..... H10D 89/921; H10D 89/10; H10D 89/931
See application file for complete search history.

(56) References Cited

U.S. PATENT DOCUMENTS

| | | | | |
|---|---|---|---|---|
| 8,723,225 B2* | 5/2014 | Hu | ..................... | H10D 84/0149 |
| | | | | 257/365 |
| 2004/0178454 A1* | 9/2004 | Kuroda | ................ | H10D 64/251 |
| | | | | 257/E29.026 |
| 2015/0187753 A1* | 7/2015 | Campi, Jr. | ........... | H10D 89/713 |
| | | | | 257/357 |
| 2017/0194312 A1* | 7/2017 | Zhou | ........................ | H10D 8/00 |
| 2017/0338218 A1* | 11/2017 | Sheu | .................... | H10D 84/151 |
| 2018/0166437 A1* | 6/2018 | Lin | ........................ | H10D 84/834 |
| 2021/0366899 A1* | 11/2021 | Liu | ........................ | H10D 89/911 |
| 2022/0262787 A1* | 8/2022 | Tanaka | .................... | H02H 9/046 |
| 2024/0290775 A1* | 8/2024 | Yen | ........................ | H10D 89/713 |
| 2025/0239541 A1* | 7/2025 | Yu | ........................ | H01Q 9/0407 |

* cited by examiner

*Primary Examiner* — Dao H Nguyen
(74) *Attorney, Agent, or Firm* — Winston Hsu

(57) ABSTRACT

An ESD guard ring structure includes numerous first fin structures, numerous second fin structures, numerous first polysilicon conductive lines, numerous second polysilicon conductive lines, numerous third polysilicon conductive lines and numerous single diffusion breaks. Each of the first fin structures includes at least one single diffusion break therein. Each of the single diffusion breaks overlaps one of the third polysilicon conductive lines.

20 Claims, 5 Drawing Sheets

BB'

CC'

1

ESD GUARD RING STRUCTURE AND FABRICATING METHOD OF THE SAME

BACKGROUND OF THE INVENTION

1. Field of the Invention

The invention relates to an electrostatic protection (ESD) ring structure and a fabricating method thereof, in particular to an ESD guard ring structure with single diffusion breaks and a fabricating method thereof.

2. Description of the Prior Art

Modern electronic processes can manufacture nanoscale devices. However, these small-sized devices increase their sensibility to ESD. Therefore, ESD guard rings are arranged around many components. The ESD guard ring design is compatible with integrated circuits. ESD guard rings can be used anywhere in a semiconductor design to provide electrical isolation between circuits, such as to prevent unwanted interactions between devices, circuits, and power supply. In addition, the ESD guard ring prevents current injection and other potential disturbances that can cause parasitic components, noise, electrostatic failure, or latch-up effects.

However, as the integrity of components increases, the volume of the ESD guard ring needs to be reduced. This causes the long strip components in the ESD guard ring easily to collapse, and damaging semiconductor performance.

SUMMARY OF THE INVENTION

In view of this, the present invention provides an ESD guard ring to solve the above problems.

According to a preferred embodiment of the present invention, an ESD guard ring structure includes a substrate, wherein a first direction is parallel to a top surface of the substrate, a second direction is parallel to the top surface of the substrate, and the first direction is perpendicular to the second direction. An ESD guard ring is disposed on the substrate, wherein the ESD guard ring forms a hollow rectangular outline, the ESD guard ring includes a plurality of first fin structures, a plurality of second fin structures, a plurality of first polysilicon conductive lines, a plurality of second polysilicon conductive lines, a plurality of third polysilicon conductive lines and a plurality of single diffusion breaks. The hollow rectangular outline includes a first lateral area, a second lateral area, a first longitudinal area and a second longitudinal area, wherein the first lateral area and the second lateral area both extend along the first direction, the first longitudinal area and the second longitudinal area both extend along the second direction, and the first longitudinal area and the second longitudinal area are both sandwiched between the first lateral area and the second lateral area. Numerous the first fin structures disposed in the first lateral area and the second lateral area, wherein each of first fin structures extends along the first direction and the first fin structures are parallel to each other along the second direction. The second fin structures are disposed in the first longitudinal area and the second longitudinal area, wherein each of the second fin structures extends along the first direction and the second fin structures are parallel to each other along the second direction. The first polysilicon conductive lines are only disposed in the first lateral area, the first longitudinal area and the second lateral area, wherein each of the first polysilicon conductive lines extends along the second direction, the first polysilicon conductive lines are parallel to each other along the first direction, and the first polysilicon conductive lines cross the first fin structures and the second fin structures. The second polysilicon conductive lines are only disposed in the first lateral area, the second longitudinal area and the second lateral area, wherein each of the second polysilicon conductive lines extends along the second direction, the second polysilicon conductive lines are parallel to each other along the first direction, and the second polysilicon conductive lines cross the first fin structures and the second fin structures. The third polysilicon conductive lines are disposed in the first lateral area and the second lateral area, wherein each of the third polysilicon conductive lines extends along the second direction, the third polysilicon conductive lines are parallel to each other along the first direction, and the third polysilicon conductive lines only cross the first fin structures. Each of the single diffusion breaks is respectably embedded in one of the first fin structures, wherein each of the single diffusion breaks in the first fin structure which is adjacent to each other does not overlap along the second direction, and each of the single diffusion breaks respectively overlaps one of the third polysilicon conductive lines.

According to another preferred embodiment of the present invention, a fabricating method of an ESD guard ring structure includes providing a substrate, wherein a first direction is parallel to a top surface of the substrate, a second direction is parallel to the top surface of the substrate, and the first direction is perpendicular to the second direction. Next, an ESD guard ring is formed to be disposed on the substrate, wherein the ESD guard ring forms a hollow rectangular outline, the ESD guard ring includes numerous first fin structures, numerous second fin structures, numerous first polysilicon conductive lines, numerous second polysilicon conductive lines, numerous third polysilicon conductive lines and numerous single diffusion breaks. The hollow rectangular outline includes a first lateral area, a second lateral area, a first longitudinal area and a second longitudinal area, the first lateral area and the second lateral area both extend along the first direction, the first longitudinal area and the second longitudinal area both extend along the second direction, and the first longitudinal area and the second longitudinal area are both sandwiched between the first lateral area and the second lateral area. The first fin structures are disposed in the first lateral area and the second lateral area, each of the first fin structures extends along the first direction and the first fin structures are parallel to each other along the second direction. The second fin structures are disposed in the first longitudinal area and the second longitudinal area, each of the second fin structures extends along the first direction and the second fin structures are parallel to each other along the second direction. The first polysilicon conductive lines are only disposed in the first lateral area, the first longitudinal area and the second lateral area, each of the first polysilicon conductive lines extends along the second direction. The first polysilicon conductive lines are parallel to each other along the first direction, and the first polysilicon conductive lines cross the first fin structures and the second fin structures. The second polysilicon conductive lines are only disposed in the first lateral area, the second longitudinal area and the second lateral area, each of the second polysilicon conductive lines extends along the second direction, the second polysilicon conductive lines are parallel to each other along the first direction, and the second polysilicon conductive lines cross the first fin structures and the second fin structures. The third polysilicon conductive lines are disposed in the first lateral area and the second lateral area, each of the third polysilicon conductive lines extends along the second direction, the third polysilicon conductive lines are parallel to each other along the first direction, and the third polysilicon conductive lines only cross the plurality of first fin structures. Each of the single diffusion breaks is respectably embedded in one of first fin structures, each of the single diffusion breaks in the first fin structures which is adjacent to each other does not overlap along the second direction, and each of the single diffusion breaks respectively overlaps one of the plurality of third poly silicon conductive lines.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating method of an ESD guard ring structure according to a preferred embodiment of the present invention, wherein:

FIG. 1 depicts a substrate with numerous first fin structures;

FIG. 2 is a fabricating stage in continuous of FIG. 1;

FIG. 3 is a fabricating stage in continuous of FIG. 2;

FIG. 4 is a fabricating stage in continuous of FIG. 3;

FIG. 5 is a fabricating stage in continuous of FIG. 4;

FIG. 6 is a fabricating stage in continuous of FIG. 5; and

FIG. 7 is a fabricating stage in continuous of FIG. 6.

DETAILED DESCRIPTION

FIG. 1 to FIG. 7 depict a fabricating method of an ESD guard ring structure according to a preferred embodiment of the present invention.

Figure 1:
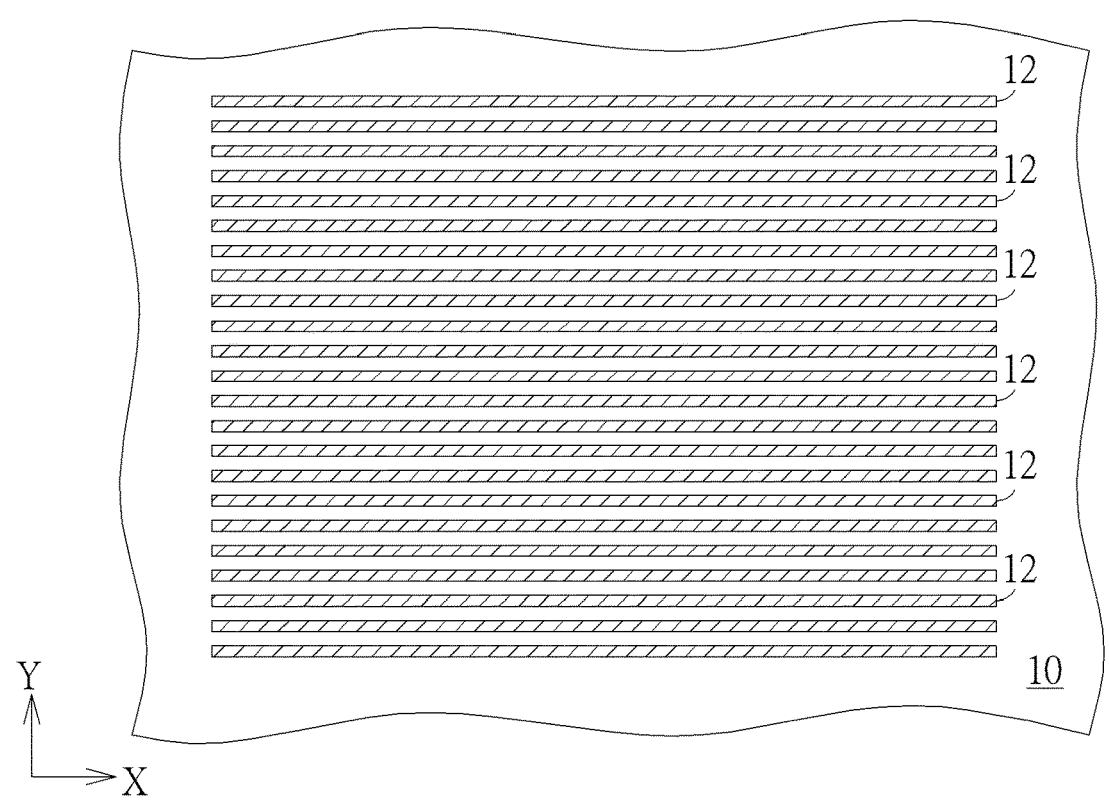
Figure 2:
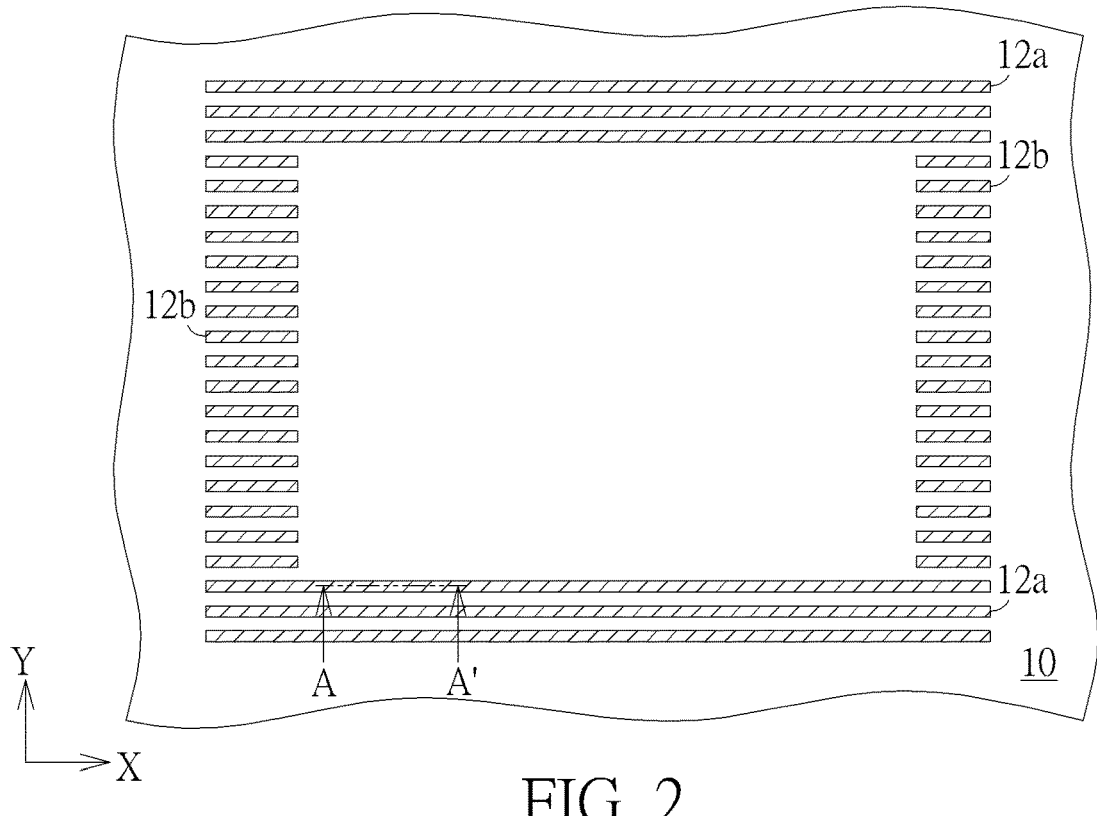

As shown in FIG. 1, a substrate 10 is provided. The substrate 10 includes a silicon substrate, a germanium substrate, a gallium arsenide substrate, a silicon germanium substrate, an indium phosphide substrate, a gallium nitride substrate, a silicon carbide substrate or a silicon on insulator substrate. A first direction X and a second direction Y are both parallel to a top surface of the substrate 10. The first direction X is perpendicular to the second direction Y. Then, the substrate 10 is etched to form numerous fin structures 12. Each of the fin structure 12 extends along the first direction X. As shown in FIG. 2, part of each of the fin structures 12 is removed, so that the remaining fin structures 12 are divided into first fin structures 12*a* and second fin-shaped structures 12*b* according to different lengths. A length of each first fin structure 12*a* is greater than a length of each second fin structure 12*b*. The first fin structures 12*a* are separated into two regions, and all second fin structures 12*b* are sandwiched between the first fin structures 12*a*.

Figure 3:
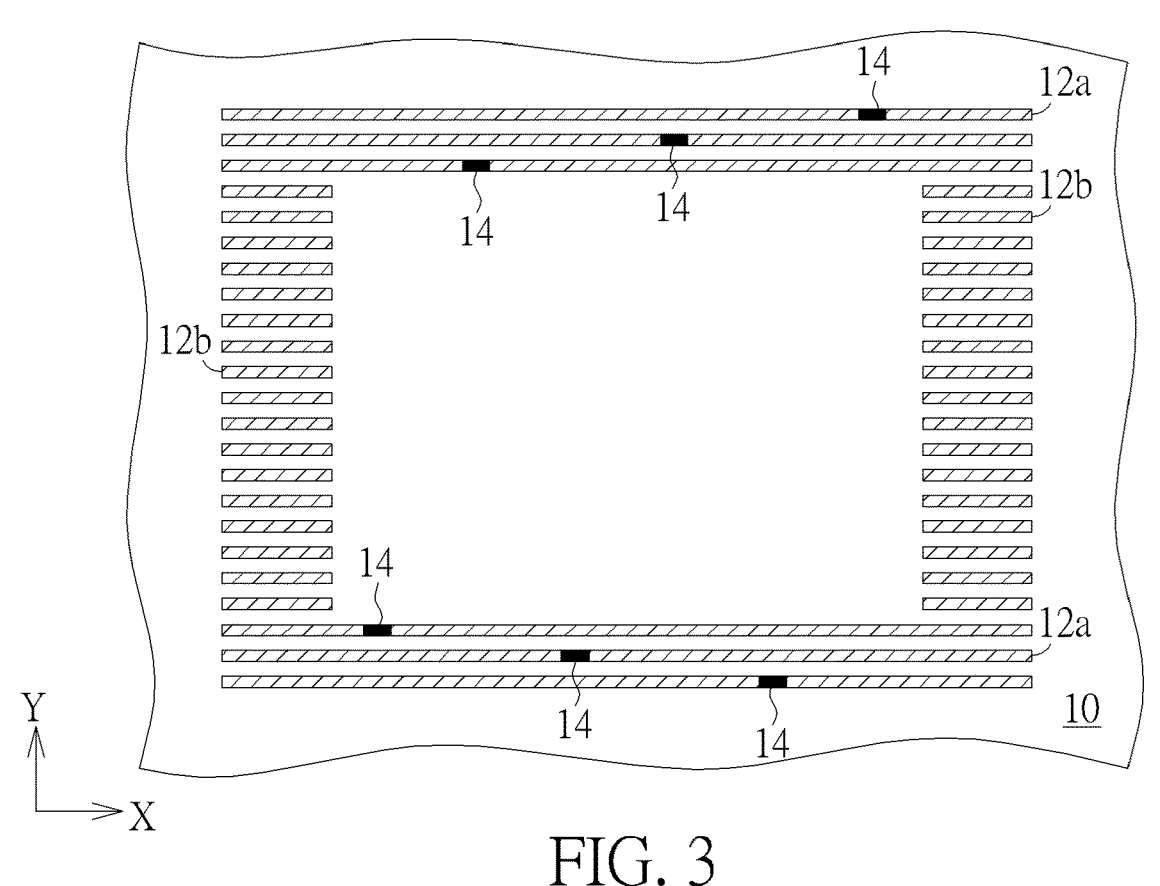
Figure 4:
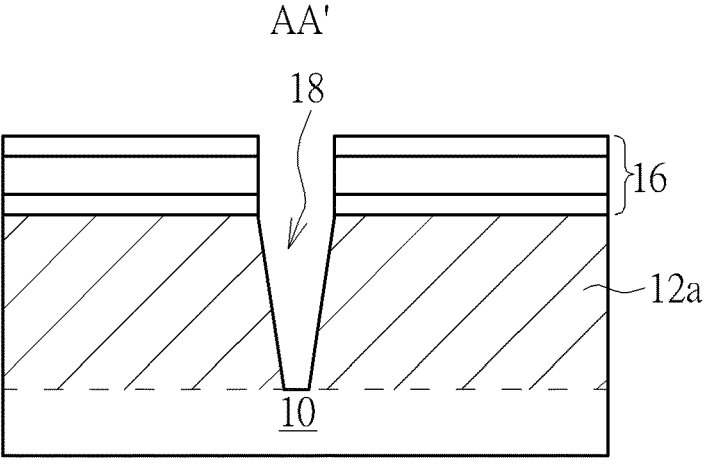
Figure 5:
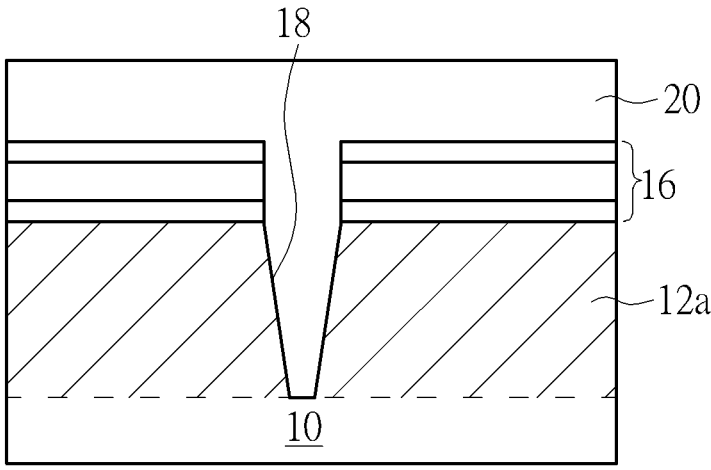
Figure 6:
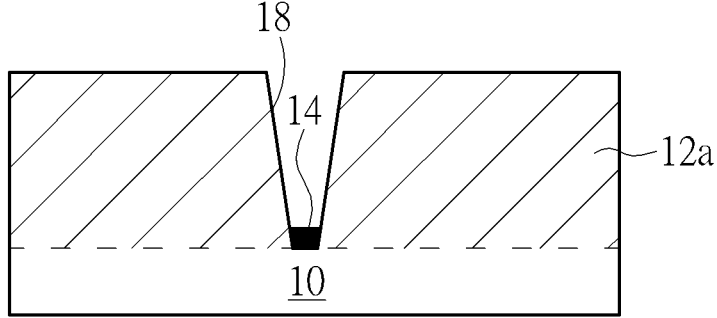

As shown in FIG. 3, numerous single diffusion breaks 14 are formed. At least one single diffusion break 14 is formed in each first fin structure 12*a*. However, according to different embodiments, more than two single diffusion breaks 14 may be formed in each first fin structure 12*a*. No single diffusion break 14 is formed any of the second fin structures 12*b*. FIG. 4 to FIG. 6 show fabricating steps of a single diffusion break. FIG. 4 shows a fabricating step following FIG. 2 in a sectional view taken along line AA' in FIG. 2. As shown in FIG. 4, a patterned mask 16 is formed to cover the first fin structure 12*a*. Then, the first fin structure 12*a* is etched to form a trench 18 by taking the patterned mask 16 as a mask. As shown in FIG. 5, a flowable chemical vapor deposition is performed to form a silicon oxide layer 20 to fill the trench 18. The silicon oxide layer 20 is also filled between the adjacent first fin structures 12*a*, the adjacent second fin structures 12*b* and between the first fin structure 12*a* and the second fin structure 12*b* which are adjacent and covers the entire substrate 10 (not shown).

As shown in FIG. 6, the silicon oxide layer 20 and the patterned mask 16 are etched back so that the silicon oxide layer 20 remains in the lower half of the trench 18, and most of the first fin structure 12*a* and most of the second fin structure 12*b* protrude from the silicon oxide layer 20 (not shown). At this time, the silicon oxide layer 18 remaining in the lower half of the trench 20 serves as the single diffusion break 14. The silicon oxide layer 20 remaining between the adjacent first fin structures 12*a*, between the adjacent second fin structures 12*b*, and between the adjacent first fin structure 12*a* and the second fin structure 12*b* serves as a shallow trench isolation (not shown). All single diffusion breaks 14 in FIG. 3 are formed in the steps described in FIG. 4 to FIG. 6.

Figure 7:
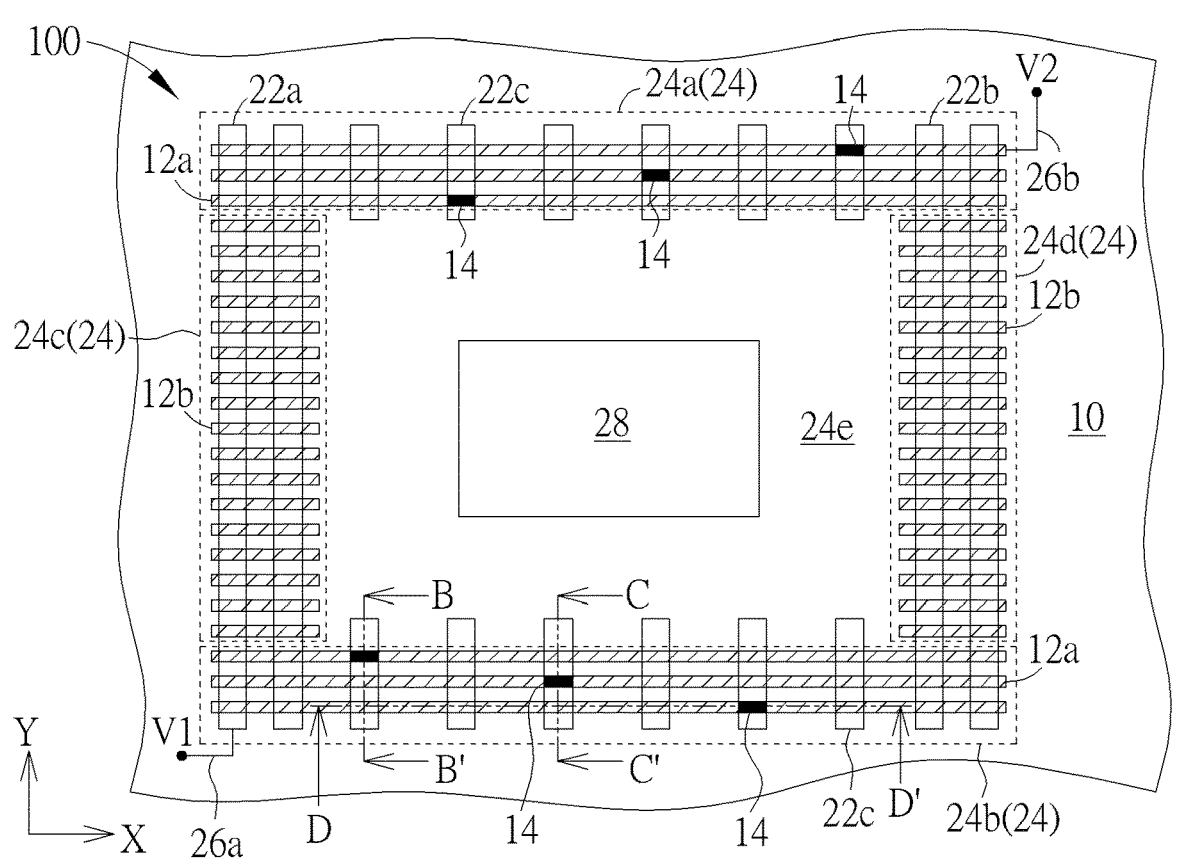

As shown in FIG. 7, a dielectric layer (not shown) such as silicon oxide is formed on the first fin structures 12*a* and the second fin structures 12*b* protruding from the shallow trench isolation (not shown). Then, numerous first polysilicon conductive lines 22*a*, numerous second polysilicon conductive lines 22*b*, and numerous third polysilicon conductive lines 22*c* are formed. The first polysilicon conductive lines 22*a*, the second polysilicon conductive lines 22*b* and the third polysilicon conductive lines 22*c* are all extend along the second direction Y. A length of each first polysilicon conductive line 22*a* is the same as a length of each second polysilicon conductive line 22*b*, and a length of each of the first polysilicon conductive line 22*a* is greater than a length of each of the third polysilicon conductive line 22*c*. The third polysilicon conductive lines 22*c* only cross the first fin structures 12*a*, and each of the single diffusion breaks 14 overlaps one of the third polysilicon conductive lines 22*c*. The first polysilicon conductive lines 22*a* and the second polysilicon conductive lines 22*b* cross the first fin structures 12*a* and the second fin structures 12*b*. There is no single diffusion break 14 in the first fin structures 12*a* directly below the first polysilicon conductive lines 22*a* and in the second fin structures 12*b* directly below the second polysilicon conductive lines 22*b*. Now, the ESD guard ring 100 of the present invention is completed.

As shown in FIG. 7, an ESD guard ring structure includes a substrate 10. A first direction X and second direction Y are parallel to a top surface of the substrate 10. The first direction X is perpendicular to the second direction Y. An ESD guard ring 100 is disposed on the substrate 10. The ESD guard ring 100 forms a hollow rectangular outline 24. The ESD guard ring 100 includes numerous first fin structures 12*a*, numerous second fin structures 12*b*, numerous first polysilicon conductive lines 22*a*, numerous second polysilicon conductive lines 22*b*, numerous third polysilicon conductive lines 22*c* and numerous single diffusion breaks 14. The hollow rectangular outline 24 includes a first lateral area 24*a*, a second lateral area 24*b*, a first longitudinal area 24*c* and a second longitudinal area 24*d* and a hollow area 24*e*. The first lateral area 24*a* and the second lateral area 24*b* both extend along the first direction X. The first longitudinal area 24*c* and the second longitudinal area 24*d* both extend along the second direction Y. The first longitudinal area 24c and the second longitudinal area 24d are both sandwiched between the first lateral area 24a and the second lateral area 24b. The first lateral area 24a, the second lateral area 24b, the first longitudinal area 24c and the second longitudinal area 24d define the hollow area 24e.

The first fin structures 12a are disposed in the first lateral area 24a and the second lateral area 24b. The number of first fin structures 12a in the first lateral area 24a and in the second lateral area 24b is preferably the same. Each of the first fin structures 12a extends along the first direction X and the first fin structures are parallel to each other along the second direction Y. The second fin structures 12b are disposed in the first longitudinal area 24c and the second longitudinal area 24d. The number of second fin structures 12b in the first longitudinal region 24c and in the second longitudinal region 24d is preferably the same. Each of the second fin structures 12b extends along the first direction X and the second fin structures 12b are parallel to each other along the second direction Y. The first polysilicon conductive lines 22a are only disposed in the first lateral area 24a, the first longitudinal area 24c and the second lateral area 24b. That is, there is no first polysilicon conductive line 22a in the second longitudinal region 24d. Each of the first polysilicon conductive lines 22a extends along the second direction Y, and each of the first polysilicon conductive lines 22a are parallel to each other along the first direction X. The first polysilicon conductive lines 22a cross the first fin structures 12a and the second fin structures 12b. The second polysilicon conductive lines 22b cross the first fin structures 12a and the second fin structures 12b. The second polysilicon conductive lines 22b are only disposed in the first lateral area 24a, the second longitudinal area 24d and the second lateral area 24b. That is, there is no second polysilicon conductive line 22b in the first longitudinal region 24c. Each of the second polysilicon conductive lines 22b extends along the second direction Y, and the second polysilicon conductive lines are parallel to each other along the first direction X. The third polysilicon conductive lines 22c are disposed in the first lateral area 24a and the second lateral area 24b. There is no third polysilicon conductive line 22c in the first longitudinal region 24c and the second longitudinal region 24d. Each of the third polysilicon conductive lines 22c extends along the second direction Y, and the third polysilicon conductive lines 22c are parallel to each other along the first direction X. The third polysilicon conductive lines 22c only cross the first fin structures 12a and do not contact the second fin structure 12b. Each of the single diffusion breaks 14 is respectably embedded in one of first fin structures 12a. Each of the single diffusion breaks 14 in the adjacent first fin structures 12a does not overlap along the second direction Y. Each of the single diffusion breaks 14 respectively overlaps one of the third poly silicon conductive lines 22c.

Moreover, a length of each of the first fin structures 12a is greater than a length of each of the second fin structures 12b. A length of each of the first polysilicon conductive lines 22a is the same as a length of each of the second polysilicon conductive lines 22b. A length of each of the first polysilicon conductive lines 22a is greater than a length of each of the third polysilicon conductive lines 22c. Furthermore, a first conductive line 26a electrically connects to the first polysilicon conductive lines 22a, the second polysilicon conductive lines 22b and the third polysilicon conductive lines 22c to make the first polysilicon conductive line 22a, the second polysilicon conductive line 22b and the third polysilicon conductive line 22c can be applied with the same voltage V1. A second conductive line 26b electrically connects to the first fin structures 12a and the second fin structures 12b to make the first fin structures 12a and the second fin structures 12b can be applied with the same voltage V2. A device 28 is disposed on the substrate 10 and in a hollow area 24e of the hollow rectangular outline 24. The device 28 can be a semiconductor device or an alignment mark. After starting the voltage V1 and the voltage V2, the ESD guard ring can prevent the device 28 from electrostatic interference.

Figure 8:
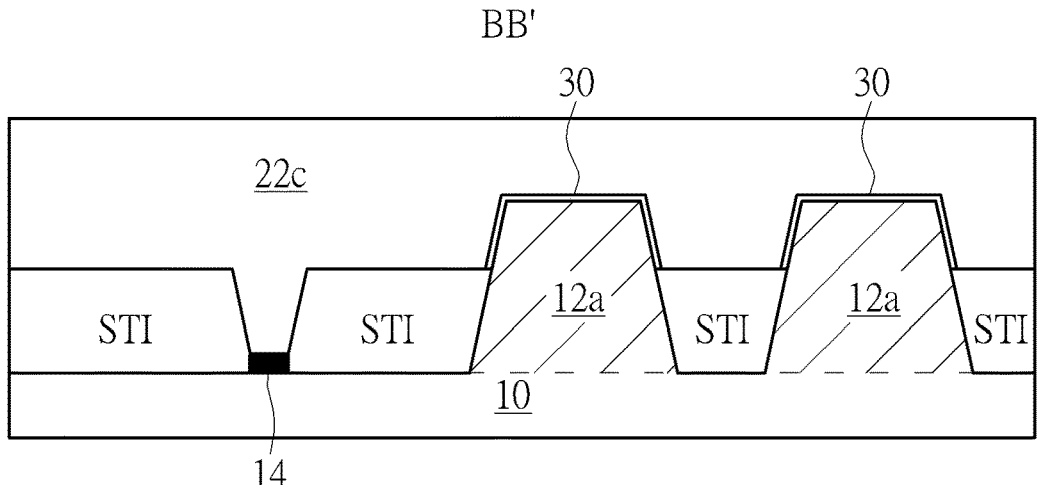
FIG. 8 depicts a sectional view taken along line BB' in FIG. 7.
Figure 9:
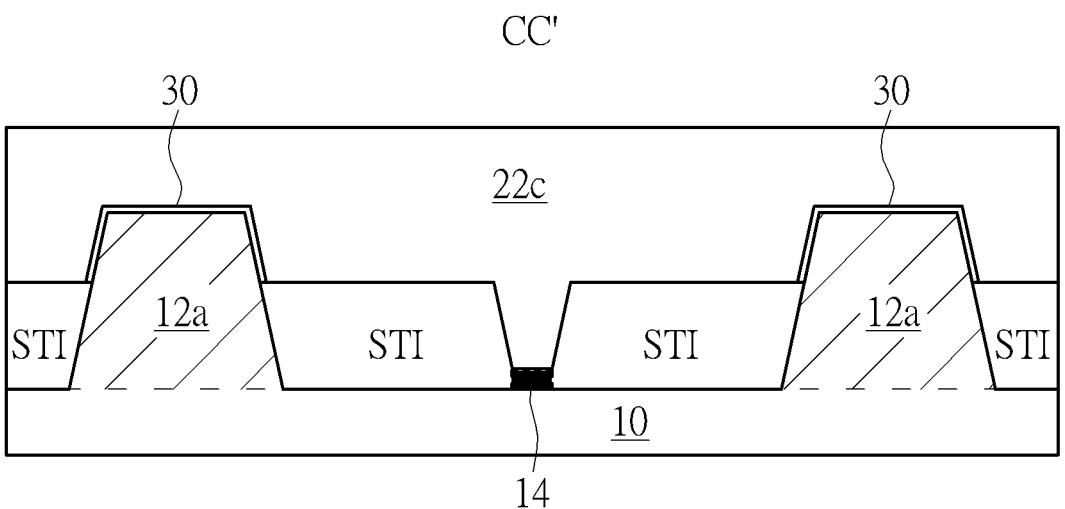
FIG. 9 is a sectional view taken along line CC' in FIG. 7.
Figure 10:
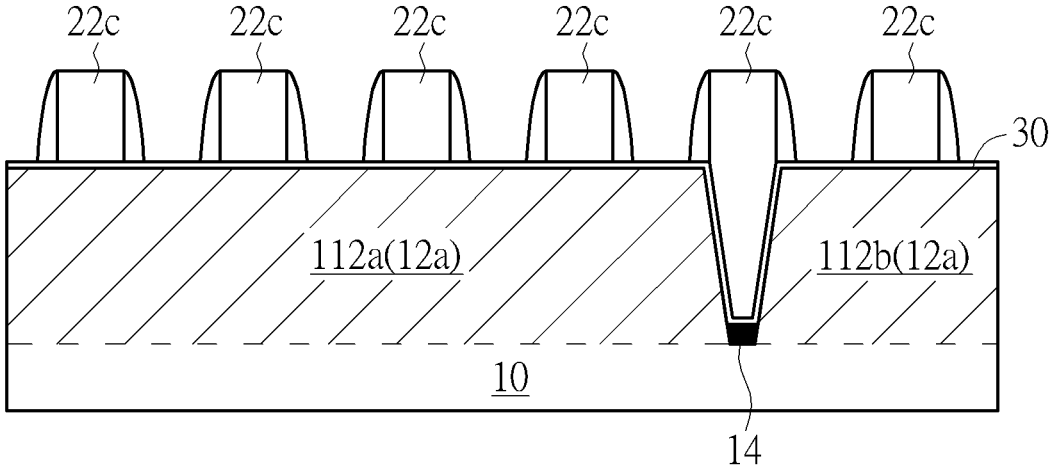
FIG. 10 is a sectional view taken along line DD' in FIG. 7.

FIG. 8 depicts a sectional view taken along line BB' in FIG. 7. FIG. 9 is a sectional view taken along line CC' in FIG. 7. FIG. 10 is a sectional view taken along line DD' in FIG. 7.

Please refer to FIG. 7 and FIG. 8. In this embodiment, three first fin structures 12a are disposed in the second lateral area 24b. Along line BB', a single diffusion break 14 is disposed on the first fin structure 12a closest to the hollow area 24e. Therefore, there is no first fin structure 12a directly above the single diffusion break 14, and the third polysilicon conductive line 22c directly contacts the single diffusion break 14. The other two first fin structures 12a do not have the single diffusion break 14 along line BB', so the first fin structures 12a are still remained. A dielectric layer 30 and the third polysilicon conductive line 22c are disposed on the first fin structure 12a. It is noteworthy that along line BB', that is, along the second direction Y, the single diffusion break 14 in the adjacent first fin structures 12a do not overlap with each other. Therefore, among the three first fin structures 12a, only the first fin structure 12a closest to the hollow area 24e has the single diffusion break 14 thereon.

Please refer to FIG. 7 and FIG. 9. In this embodiment, three first fin structures 12a are disposed in the second lateral area 24b. Along line CC', the first fin structure 12a in the middle has the single diffusion break 14 thereon, and the remaining two first fin structures 12a do not have the single diffusion break 14 along line CC'. Similarly, this embodiment also show that along line CC', that is, along the second direction Y, the single diffusion break 14 in the adjacent first fin structures 12a do not overlap with each other.

Please refer to FIG. 7 and FIG. 10. In this embodiment, only one single diffusion break 14 is disposed on the first fin structure 12a farthest from the hollow area 24e. The single diffusion break 14 separates the first fin structure 12a into a first sub fin structure 112a and a second sub fin structure 112b. The third polysilicon conductive line 22c directly above the single diffusion break 14 is partially buried in the first fin structure 12a. Since there is no single diffusion break 14 at other positions of the first fin structure 12a, the third polysilicon conductive lines 22c are all located on the top surface of the first fin structure 12a. In addition, spacers may be disposed on two sides of each third polysilicon conductive line 22c.

The single diffusion break 14 of the present invention is used to separate each first fin structure 12a into shorter sub fin structures 112a/112b in order to reduce the collapse possibility of the first fin structures 12a in subsequent processes. In addition, along the second direction Y, the reason why the single diffusion breaks 14 in adjacent first fin structures 12a do not overlap is that while forming the single diffusion breaks 14, the silicon oxide layer 20 needs to be etched back, if the single diffusion breaks 14 are all disposed on the same line such as line BB' or line CC', during the etching back, the stress will be too concentrated in the same area, causing dishing on the surface of the single diffusion breaks 14 and the adjacent shallow trench isolation.

Those skilled in the art will readily observe that numerous modifications and alterations of the device and method may be made while retaining the teachings of the invention.

Accordingly, the above disclosure should be construed as limited only by the metes and bounds of the appended claims

What is claimed is:

1. An electrostatic discharge (ESD) guard ring structure, comprising:

a substrate, wherein a first direction is parallel to a top surface of the substrate, a second direction is parallel to the top surface of the substrate, and the first direction is perpendicular to the second direction;

an ESD guard ring disposed on the substrate, wherein the ESD guard ring forms a hollow rectangular outline, the ESD guard ring comprises a plurality of first fin structures, a plurality of second fin structures, a plurality of first polysilicon conductive lines, a plurality of second polysilicon conductive lines, a plurality of third poly-silicon conductive lines and a plurality of single diffusion breaks, and wherein:

the hollow rectangular outline comprises a first lateral area, a second lateral area, a first longitudinal area and a second longitudinal area, the first lateral area and the second lateral area both extend along the first direction, the first longitudinal area and the second longitudinal area both extend along the second direction, and the first longitudinal area and the second longitudinal area are both sandwiched between the first lateral area and the second lateral area, the plurality of the first fin structures are disposed in the first lateral area and the second lateral area, each of the plurality of first fin structures extends along the first direction and the plurality of first fin structures are parallel to each other along the second direction, the plurality of the second fin structures are disposed in the first longitudinal area and the second longitudinal area, each of the plurality of second fin structures extends along the first direction and the plurality of second fin structures are parallel to each other along the second direction, the plurality of first polysilicon conductive lines are only disposed in the first lateral area, the first longitudinal area and the second lateral area, each of the plurality of first polysilicon conductive lines extends along the second direction, the plurality of first polysilicon conductive lines are parallel to each other along the first direction, and the plurality of first polysilicon conductive lines cross the plurality of first fin structures and the plurality of second fin structures;

the plurality of second polysilicon conductive lines are only disposed in the first lateral area, the second longitudinal area and the second lateral area, each of the plurality of second polysilicon conductive lines extends along the second direction, the plurality of second polysilicon conductive lines are parallel to each other along the first direction, and the plurality of second polysilicon conductive lines cross the plurality of first fin structures and the plurality of second fin structures, the plurality of third polysilicon conductive lines are disposed in the first lateral area and the second lateral area, each of the plurality of third polysilicon con-ductive lines extends along the second direction, the plurality of third polysilicon conductive lines are parallel to each other along the first direction, and the plurality of third polysilicon conductive lines only cross the plurality of first fin structures, and each of the plurality of single diffusion breaks are respectably embedded in one of the plurality of first fin structures, each of the plurality single diffusion breaks respectively in the plurality of first fin struc-tures which is adjacent to each other does not overlap along the second direction, and each of the plurality of single diffusion breaks respectively overlaps one of the plurality of third poly silicon conductive lines.

2. The ESD guard ring of claim 1, wherein a length of each of the plurality of first fin structures is greater than a length of each of the plurality of second fin structures.

3. The ESD guard ring structure of claim 1, wherein a length of each of the plurality of first polysilicon conductive lines is the same as a length of each of the plurality of second polysilicon conductive lines.

4. The ESD guard ring structure of claim 1, wherein a length of each of the plurality of first polysilicon conductive lines is greater than a length of each of the plurality of third polysilicon conductive lines.

5. The ESD guard ring structure of claim 1, further comprising a first conductive line electrically connects to the plurality of first polysilicon conductive lines, the plurality of second polysilicon conductive lines and the plurality of third polysilicon conductive lines.

6. The ESD guard ring structure of claim 1, further comprising a second conductive line electrically connects to the plurality of first fin structures and the plurality of second fin structures.

7. The ESD guard ring structure of claim 1, wherein each of the plurality of single diffusion breaks comprises:

a trench disposed in one of the plurality of first fin structures; and a silicon oxide layer filling the trench.

8. The ESD guard ring structure of claim 1, further comprising a semiconductor device disposed on the sub-strate and in a hollow area of the hollow rectangular outline.

9. The ESD guard ring structure of claim 1, further comprising an alignment mark disposed on the substrate and in a hollow area of the hollow rectangular outline.

10. The ESD guard ring structure of claim 1, wherein there is no single diffusion break disposed on the plurality of second fin structures.

11. A fabricating method of an electrostatic discharge (ESD) guard ring structure, comprising:

providing a substrate, wherein a first direction is parallel to a top surface of the substrate, a second direction is parallel to the top surface of the substrate, and the first direction is perpendicular to the second direction;

forming an ESD guard ring disposed on the substrate, wherein the ESD guard ring forms a hollow rectangular outline, the ESD guard ring comprises a plurality of first fin structures, a plurality of second fin structures, a plurality of first polysilicon conductive lines, a plu-rality of second polysilicon conductive lines, a plurality of third polysilicon conductive lines and a plurality of single diffusion breaks, and wherein:

the hollow rectangular outline comprises a first lateral area, a second lateral area, a first longitudinal area and a second longitudinal area, the first lateral area and the second lateral area both extend along the first direction, the first longitudinal area and the second longitudinal area both extend along the second direc-tion, and the first longitudinal area and the second longitudinal area are both sandwiched between the first lateral area and the second lateral area, the plurality of the first fin structures are disposed in the first lateral area and the second lateral area, each of the plurality of first fin structures extends along the first direction and the plurality of first fin structures are parallel to each other along the second direction, the plurality of the second fin structures are disposed in the first longitudinal area and the second longitudinal area, each of the plurality of second fin structures extends along the first direction and the plurality of second fin structures are parallel to each other along the second direction, the plurality of first polysilicon conductive lines are only disposed in the first lateral area, the first longitudinal area and the second lateral area, each of the plurality of first polysilicon conductive lines extends along the second direction, the plurality of first polysilicon conductive lines are parallel to each other along the first direction, and the plurality of first polysilicon conductive lines cross the plurality of first fin structures and the plurality of second fin structures, the plurality of second polysilicon conductive lines are only disposed in the first lateral area, the second longitudinal area and the second lateral area, each of the plurality of second polysilicon conductive lines extends along the second direction, the plurality of second polysilicon conductive lines are parallel to each other along the first direction, and the plurality of second polysilicon conductive lines cross the plurality of first fin structures and the plurality of second fin structures, the plurality of third polysilicon conductive lines are disposed in the first lateral area and the second lateral area, each of the plurality of third polysilicon conductive lines extends along the second direction, the plurality of third polysilicon conductive lines are parallel to each other along the first direction, and the plurality of third polysilicon conductive lines only cross the plurality of first fin structures, and each of the plurality of single diffusion breaks is respectably embedded in one of the plurality of first fin structures, each of the plurality single diffusion breaks respectively in the plurality of first fin structures which is adjacent to each other does not overlap along the second direction, and each of the plurality of single diffusion breaks respectively overlaps one of the plurality of third poly silicon conductive lines.

12. The fabricating method of an ESD guard ring structure of claim 11, wherein a length of each of the plurality of first fin structures is greater than a length of each of the plurality of second fin structures.

13. The fabricating method of an ESD guard ring structure of claim 11, wherein a length of each of the plurality of first polysilicon conductive lines is the same as a length of each of the plurality of second polysilicon conductive lines.

14. The fabricating method of an ESD guard ring structure of claim 11, wherein a length of each of the plurality of first polysilicon conductive lines is greater than a length of each of the plurality of third polysilicon conductive lines.

15. The fabricating method of an ESD guard ring structure of claim 11, further comprising a first conductive line electrically connects to the plurality of first polysilicon conductive lines, the plurality of second polysilicon conductive lines and the plurality of third polysilicon conductive lines.

16. The fabricating method of an ESD guard ring structure of claim 11, further comprising a second conductive line electrically connects to the plurality of first fin structures and the plurality of second fin structures.

17. The fabricating method of an ESD guard ring structure of claim 11, wherein each of the plurality of single diffusion breaks comprises:

a trench disposed in one of the plurality of first fin structures; and a silicon oxide layer filling the trench.

18. The fabricating method of an ESD guard ring structure of claim 11, further comprising a semiconductor device disposed on the substrate and in a hollow area of the hollow rectangular outline.

19. The fabricating method of an ESD guard ring structure of claim 11, further comprising an alignment mark disposed on the substrate and in a hollow area of the hollow rectangular outline.

20. The fabricating method of an ESD guard ring structure of claim 11, wherein there is no single diffusion break disposed on the plurality of second fin structures.

* * * * *